(12) United States Patent
Sugimoto et al.

(10) Patent No.: US 6,602,616 B2
(45) Date of Patent: Aug. 5, 2003

(54) COMPOSITE MULTILAYER CERAMIC ELECTRONIC PARTS AND METHOD OF MANUFACTURING THE SAME

(75) Inventors: Yasutaka Sugimoto, Kyoto (JP); Osamu Chikagawa, Moriyama (JP); Naoya Mori, Omihachiman (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 10/006,270

(22) Filed: Dec. 5, 2001

(65) Prior Publication Data

US 2002/0142187 A1 Oct. 3, 2002

(30) Foreign Application Priority Data

Dec. 19, 2000 (JP) ........................................ 2000-385565
Jun. 15, 2001 (JP) ........................................ 2001-182131

(51) Int. Cl.[7] ............................... B32B 9/00; C03C 14/00
(52) U.S. Cl. ..................... 428/688; 428/697; 501/32; 501/139
(58) Field of Search ................... 501/32, 139; 428/688

(56) References Cited

U.S. PATENT DOCUMENTS 6,107,228 A * 8/2000 Sugimoto et al. .......... 501/139
2002/0025439 A1   2/2002 Ueda et al.

FOREIGN PATENT DOCUMENTS

| GB | 2355260 A | * | 4/2001 |
| GB | 2360036 A | * | 9/2001 |
| JP | 05-235550 |   | 9/1993 |
| JP | 07-321465 |   | 12/1995 |
| JP | 2000-211967 |   | 8/2000 |
| JP | 2000-226255 |   | 8/2000 |
| JP | 2000-226256 |   | 8/2000 |
| JP | 2000-264724 |   | 9/2000 |
| JP | 2000-281436 |   | 10/2000 |

OTHER PUBLICATIONS

UK Search Report dated May 29, 2002.

* cited by examiner

*Primary Examiner*—Deborah Jones
*Assistant Examiner*—G. A. Blackwell-Rudasill
(74) *Attorney, Agent, or Firm*—Dickstein, Shapiro, Morin & Oshinsky, LLP.

(57) ABSTRACT

A composite multilayer ceramic electronic part includes a high dielectric-constant layer and at least one low dielectric-constant layer laminated with each other, the high dielectric-constant layer including a high dielectric-constant material and has a relative dielectric constant $\epsilon r$ of about 20 or more, and the low dielectric-constant layer including a low dielectric-constant material and has a relative dielectric constant $\epsilon r$ of about 10 or less. The high dielectric-constant material mainly comprises a $BaO\text{---}TiO_2\text{---}ReO_{3/2}$ dielectric and a first glass composition, the $BaO\text{---}TiO_2\text{---}ReO_{3/2}$ dielectric being represented by $xBaO\text{-}yTiO_2\text{-}zReO_{3/2}$, where x, y and z are % by mole and satisfy the following conditions: $8 \leq x \leq 18$; $52.5 \leq y \leq 65$; $20 \leq z \leq 40$; and $x+y+z=100$; and Re is a rare earth element, and the low dielectric-constant material comprises a composite of a ceramic and a second glass composition. The composite multilayer ceramic electronic part is resistant to delamination or deformation at the interface between the different types of materials, can be fired at low temperatures and is suitable for the high-frequency applications.

21 Claims, 3 Drawing Sheets

COMPOSITE MULTILAYER CERAMIC ELECTRONIC PARTS AND METHOD OF MANUFACTURING THE SAME

BACKGROUND OF THE INVENTION

1. Field of the Invention

The present invention relates to a composite multilayer ceramic electronic part that is suitable for a multilayer circuit board including, for example, a microwave resonator, a filter or a multilayer capacitor, and to a method of manufacturing the same. Specifically, it relates to a composite multilayer ceramic electronic part comprising a laminate of a high dielectric-constant layer including a high dielectric-constant material with a low dielectric-constant layer including a low dielectric-constant material.

2. Description of the Related Art

Electronic equipment has become smaller in size, weight and thickness in recent years, and demands have been made to miniaturize electronic parts for use in such electronic equipment. However, conventional electronic part devices such as resonators are separately designed and constituted, and the miniaturization of these devices alone cannot sufficiently miniaturize the electronic equipment. Various multilayer ceramic substrates including electronic part devices such as capacitors or resonators inside thereof have therefore been proposed.

Such multilayer ceramic substrates must be further miniaturized and must be applied to signals of high frequency, and to this end, a variety of materials for composite multilayer substrates has been studied and proposed. Specifically, a variety of composite multilayer ceramic electronic parts including a low dielectric-constant layer and a high dielectric-constant layer have been proposed. In these ceramic electronic parts, a wiring is formed or a semiconductor device is mounted onto the low dielectric-constant layer. The high dielectric-constant layer is formed inside the low dielectric-constant layer, and comprises a material having a high dielectric constant and a low dielectric loss and thereby constitutes a capacitor or resonator. An example of these composite multilayer ceramic electronic parts is described in Japanese Unexamined Patent Application Publication No. 12-264724.

However, such composite multilayer ceramic electronic parts comprise a combination of a low dielectric-constant material and a high dielectric-constant material and thereby invite delamination in the interface between the two materials or deformation of the resulting substrates due to the difference in the shrinkage profile or in the thermal expansion coefficient between the two materials.

In high-frequency applications, Cu, Ag and other conductors which have a low electric resistance and a low melting point must be used. Accordingly, ceramic materials for use with these conductors must be fired at temperatures less than or equal to 1000° C., since the ceramics must be integrally fired with these conductors having a low melting point.

The substrate materials must have a low dielectric loss for use in a microwave region, millimeter wave region and other high frequency regions. To yield a substrate material that can be fired at temperatures less than or equal to 1000° C., it must further comprise a sintering aid such as glass in addition to a ceramic. However, sintering aids such as glass generally serve to increase the dielectric loss of the substrate material. For this reason, a substrate material, which can be fired at low temperatures of less than or equal to 1000° C. and has a low dielectric loss, cannot significantly be obtained.

SUMMARY OF THE INVENTION

Under these circumstances, an object of the present invention is to provide a composite multilayer ceramic electronic part which is resistant to delamination or deformation in the interface between different types of materials, can be fired at low temperatures and is suitable for the high-frequency applications, and a method of manufacturing the multilayer composite ceramic electronic part.

Specifically, the present invention provides, in one aspect, a composite multilayer ceramic electronic part including a high dielectric-constant layer and at least one low dielectric-constant layer laminated with each other. The high dielectric-constant layer includes a high dielectric-constant material and has a relative dielectric constant εr of equal to or more than about 20, and the low dielectric-constant layer includes a low dielectric-constant material and has a relative dielectric constant εr of less than or equal to about 10. In this multilayer composite ceramic electronic part, the high dielectric-constant material mainly includes a BaO—$TiO_2$—$ReO_{3/2}$ dielectric and a first glass composition, where the BaO—$TiO_2$—$ReO_{3/2}$ dielectric is represented by the following formula: xBaO—y$TiO_2$—z$ReO_{3/2}$, where x, y and z are % by mole and satisfy the following conditions: $8 \leq x \leq 18$; $52.5 \leq y \leq 65$; $20 \leq z \leq 40$; and x+y+z=100; and Re is a rare earth element, and the low dielectric-constant material includes a composite of a ceramic and a second glass composition.

By this configuration, the high dielectric-constant layer can constitute a capacitor or resonator using its high dielectric constant. In addition, the high dielectric-constant material yields a low dielectric loss in the high-frequency regions, specifically in the microwave region or millimeter wave region, due to crystallization of the glass composition, and thereby can constitute a capacitor or resonator having excellent high-frequency characteristics. The high dielectric-constant material can be fired at low temperatures of less than or equal to 1000° C., and a conductor mainly comprising a metal having a low relative resistance such as gold, silver or copper can be used.

The low dielectric-constant layer has a low relative dielectric constant εr of less than or equal to about 10 and can thereby constitute an insulator.

By using the combination of the high dielectric-constant layer and the low dielectric-constant layer, the present invention can provide a composite multilayer ceramic electronic part including a resonator or capacitor having excellent high-frequency characteristics.

The first glass composition in the high dielectric-constant material preferably includes about 10% to 25% by weight of $SiO_2$, about 10% to 40% by weight of $B_2O_3$, about 25% to 55% by weight of MgO, 0% to about 20% by weight of ZnO, 0% to about 15% by weight of $Al_2O_3$, about 0.5% to 10% by weight of $Li_2O$ and 0% to about 10% by weight of RO, where R is at least one of Ba, Sr and Ca.

The high dielectric-constant material preferably further includes less than or equal to about 3% by weight of CuO and about 0.1% to 10% by weight of $TiO_2$ based on the total weight of the high dielectric-constant material, as secondary components.

The high dielectric-constant material may include about 15% to 35% by weight of the first glass composition relative to about 65% to 85% by weight of the BaO—$TiO_2$—$ReO_{3/2}$ dielectric.

Preferably, the ceramic in the low dielectric-constant material is spinel ($MgAl_2O_4$), and the second glass composition includes about 30% to 50% by mole of silicon oxides in terms of $SiO_2$, 0% to about 20% by mole of boron oxides in terms of $B_2O_3$, and about 20% to 55% by mole of magnesium oxide in terms of MgO.

The second glass composition preferably further includes less than or equal to about 30% by mole of at least one of CaO, SrO and BaO based on the total amount of the second glass composition.

The second glass composition preferably includes 0% to about 15% by mole of aluminum oxides in terms of $Al_2O_3$.

The second glass composition may further include less than or equal to about 10% by weight of at least one alkali metal oxide selected from $Li_2O$, $K_2O$ and $Na_2O$, based on the total weight of the second glass composition.

The low dielectric-constant material may further include less than or equal to about 3% by weight of copper oxides in terms of CuO based on the total weight of the low dielectric-constant material.

Preferably, the ceramic in the low dielectric-constant material is $MgAl_2O_4$, the second glass composition is a borosilicate glass, and an $MgAl_2O_4$ crystalline phase and at least one of an $Mg_3B_2O_6$ crystalline phase and an $Mg_2B_2O_5$ crystalline phase are precipitated as major crystalline phases in the low dielectric-constant layer.

In this case, the low dielectric-constant layer may include about 5% to 80% by weight of the $MgAl_2O_4$ crystalline phase and about 5% to 70% by weight of at least one of the $Mg_3B_2O_6$ crystalline phase and the $Mg_2B_2O_5$ crystalline phase.

Alternatively, the ceramic in the low dielectric-constant material may be $MgAl_2O_4$, the second glass composition may be a borosilicate glass, and an $MgAl_2O_4$ crystalline phase, an $Mg_2SiO_4$ crystalline phase, and at least one of an $Mg_3B_2O_6$ crystalline phase and an $Mg_2B_2O_5$ crystalline phase may be precipitated as major crystalline phases in the low dielectric-constant layer.

In this case, the low dielectric-constant layer may include about 5% to 80% by weight of the $MgAl_2O_4$ crystalline phase and about 5% to 70% by weight of the total of the $Mg_2SiO_4$ crystalline phase and at least one of the $Mg_3B_2O_6$ crystalline phase and the $Mg_2B_2O_5$ crystalline phase.

By these configurations, the low dielectric-constant material can be fired at low temperatures of less than or equal to 1000° C. The high dielectric-constant layer and the low dielectric-constant layer can therefore integrally be fired at low temperatures of less than or equal to 1000° C. and can further be co-fired with a conductor mainly including a metal having a low relative resistance, such as gold, silver or copper. In addition, the low dielectric-constant layer can yield a low dielectric loss in the high-frequency regions, specifically in the microwave region or millimeter wave region, due to crystallization of the glass composition as in the high dielectric-constant material and thereby yields a composite multilayer ceramic electronic part having further excellent high-frequency characteristics.

The borosilicate glass preferably includes about 8% to 60% by weight of boron oxides in terms of $B_2O_3$, about 10% to 50% by weight silicon oxides in terms of $SiO_2$, and 10% to 55% by weight of magnesium oxide in terms of MgO.

The borosilicate glass may include 0% to about 20% by weight of at least one alkali metal oxide in terms of oxide.

In the low dielectric-constant material, the weight ratio of the ceramic and the second glass composition is preferably from about 20:80 to 80:20.

In the composite multilayer ceramic electronic part, the difference in the thermal expansion coefficient between the low dielectric-constant material and the high dielectric-constant material is preferably less than or equal to about 0.5 ppm/°C.

The present invention provides, in another aspect, a method of manufacturing a composite multilayer ceramic electronic part in which the composite multilayer ceramic electronic part includes a laminate of at least one high dielectric-constant layer having a relative dielectric constant of equal to or more than about 20 with at least one low dielectric-constant layer having a relative dielectric constant of less than or equal to about 10. The method includes the steps of preparing a laminate of at least one ply of a first ceramic green sheet with at least one ply of a second ceramic green sheet, and firing the laminate under such conditions that two plies of a third ceramic green sheet are pressed to and sandwich the top and bottom faces of the laminate. In this method, the first ceramic green sheet includes a composition of a high dielectric-constant material for constituting the high dielectric-constant layer, the second ceramic green sheet includes a composition of a low dielectric-constant material for constituting the low dielectric-constant layer, and the third ceramic green sheet includes a ceramic having a sintering temperature higher than the sintering temperatures of the low dielectric-constant material and the high dielectric-constant material.

By this configuration, the laminate can be prevented from shrinkage in an in-plane direction in the top and bottom faces thereof and thereby yields a composite multilayer ceramic electronic part having excellent dimensional precision.

DESCRIPTION OF THE PREFERRED EMBODIMENTS

The present invention will be illustrated in detail below.

The composite multilayer ceramic electronic part of the present invention has a multilayer structure comprising at least one ply of a high dielectric-constant layer including the above specific high dielectric-constant material, and at least one ply of a low dielectric-constant layer including the above specific low dielectric-constant material. The high dielectric-constant material comprises a ceramic composition including the $BaO$—$TiO_2$—$ReO_{3/2}$ dielectric represented by the above formula and has satisfactory dielectric characteristics in the high frequency regions.

The high dielectric-constant layer has a relative dielectric constant of equal to or more than about 20 and can thereby constitute a device such as a capacitor or a resonator.

The high dielectric-constant material mainly comprises the $BaO$—$TiO_2$—$ReO_{3/2}$ dielectric represented by the above formula and a first glass composition having the specified composition. By this configuration, it can be fired at temperatures less than or equal to 1000° C. and therefore can be co-fired with a highly conductive metal such as Ag, Au or Cu, as shown in examples mentioned later.

In addition, the high dielectric-constant material exhibits a high relative dielectric constant of equal to or more than about 20 in the high frequency regions, particularly in the microwave region and millimeter wave region, and has excellent temperature stability. It also has a high Q factor, since a glass component comprising the first glass composition is crystallized and thereby yields $Mg_2B_2O_5$, $Mg_3B_2O_6$, $BaTi_4O_9$, $Ba_2Ti_9O_{20}$, $Mg_2TiO_4$, $Mg_2SiO_4$, $ZnAl_2O_4$, $ZnTiO_3$, $Zn_2TiO_4$, $Zn_2Ti_3O8$, $LiAlSiO_4$ and other crystals each having a high Q factor.

Rare earth elements Re for use in the $BaO-TiO_2-ReO_{3/2}$ dielectric are not specifically limited and include Sc, Y, La, Ce, Pr, Nd, Pm, Sm, Eu, Gd, Th, Dy, Ho, Er, Tm, Yb and Lu. Each of these elements can be used alone or in combination.

The composition of the $BaO-TiO_2-ReO_{3/2}$ dielectric is specified as $xBaO-yTiO_2-zReO_{3/2}$ for the following reasons.

Figure 1:
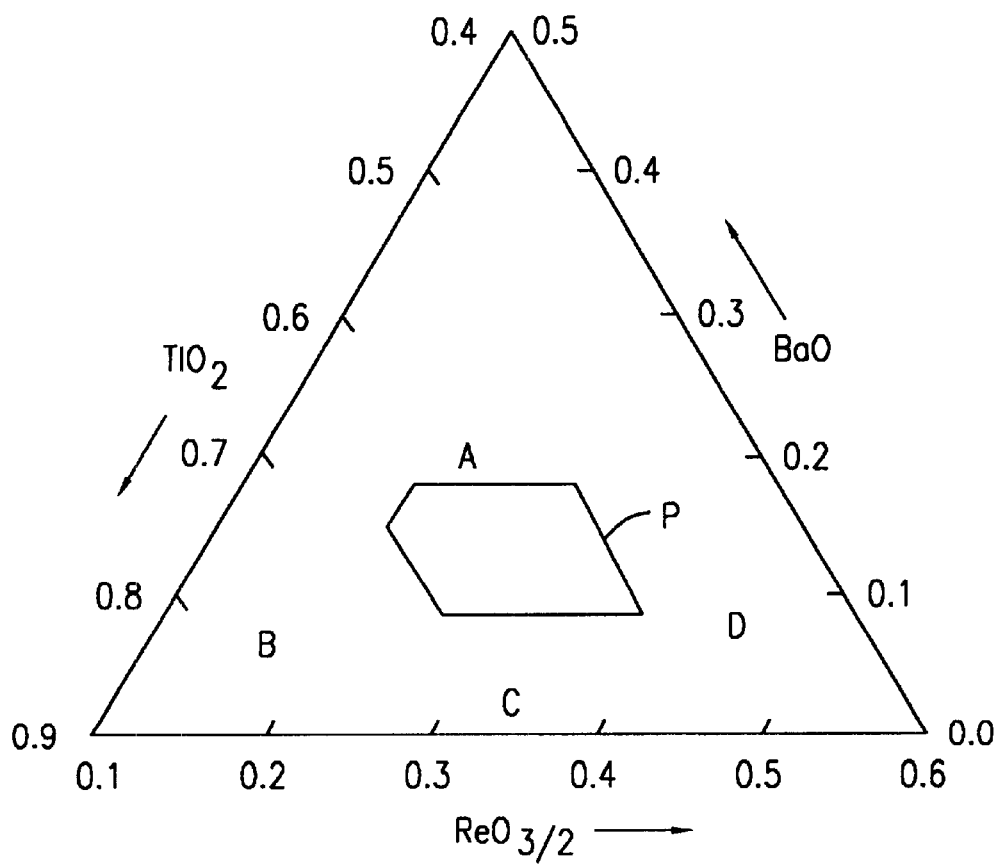
FIG. 1 is a ternary compositional diagram of a $BaO$—$TiO_2$—$ReO_{3/2}$ ceramic composition for use as a dielectric ceramic composition in the present invention.

FIG. 1 is a ternary compositional diagram of a $BaO-TiO_2-ReO_{3/2}$ dielectric ceramic composition. The region surrounded by a solid line P corresponds to the composition represented by $xBaO-yTiO_2-zReO_{3/2}$.

In a region A shown in FIG. 1, where x is equal to or more than 18, the $BaO-TiO_2-ReO_{3/2}$ ceramic composition cannot be sintered and only yields a porous ceramic even by firing at temperatures equal to or more than 1400° C. In a region B, where y is more than 65 and z is less than 20, the resulting ceramic has deteriorated temperature characteristics. Specifically, when a substrate including a capacitor is formed by using this ceramic, the capacitor exhibits a temperature-dependent change of electrostatic capacity shifted to a high negative value. In a region C, where x is less than 8, the resulting dielectric ceramic has an excessively low relative dielectric constant and unstable sinterability. In a region D, where z exceeds 40 and y is less than 52.5, the resulting ceramic exhibits a temperature-dependent change of electrostatic capacity shifted to a high positive value and a decreased relative dielectric constant.

The first glass composition preferably comprises about 10% to 25% by weight of $SiO_2$, about 10% to 40% by weight of $B_2O_3$, about 25% to 55% by weight of MgO, 0% to about 20% by weight of ZnO, 0% to about 15% by weight of $Al_2O_3$, about 0.5% to 10% by weight of $Li_2O$ and 0% to about 10% by weight of RO, where R is at least one of Ba, Sr and Ca. The first glass composition does not necessarily contain ZnO, $Al_2O_3$ and RO.

The $B_2O_3$ component serves to decrease the viscosity of the glass component and thereby accelerate the sintering of the dielectric ceramic composition for the high dielectric-constant material. It also yields $Mg_2B_2O_5$, $Mg_3B_2O_6$ and other crystals having a high Q factor. However, if the content of $B_2O_3$ exceeds about 40% by weight, the resulting high dielectric-constant material may have decreased moisture resistance, and if it is less than about 10% by weight, the high dielectric-constant material may not be sintered at temperatures less than or equal to 1000° C. $SiO_2$ yields $Mg_2SiO_4$, $LiAlSiO_4$ and other crystals having a high Q factor. If the content of $SiO_2$ exceeds about 25% by weight, the glass component may have an increased softening point and the dielectric ceramic composition may have deteriorated sinterability. If it is less than about 10% by weight, the resulting high dielectric-constant material may have insufficient moisture resistance in some cases.

MgO serves to accelerate the reaction between the $BaO-TiO_2-ReO_{3/2}$ ceramic composition and the first glass composition and to decrease the softening point of the first glass composition. In addition, MgO yields $Mg_2B_2O_5$, $Mg_3B_2O_6$, $Mg_2TiO_4$, $Mg_2SiO_4$ and other crystals having a high Q factor.

If the content of MgO is less than about 25% by weight, the high dielectric-constant material may have decreased sinterability and thereby may not sufficiently be sintered at temperatures less than or equal to 1000° C. If it exceeds about 55% by weight, the high dielectric-constant material has deteriorated moisture resistance, and the glass component cannot be vitrified.

$Li_2O$ serves to decrease the softening point of the glass component. If the content of $Li_2O$ exceeds about 10% by weight, the resulting high dielectric-constant material may have decreased moisture resistance. If it is less than about 0.5% by weight, the glass component may have an increased softening point, and the high dielectric-constant material may not sufficiently be sintered.

ZnO serves to increase the Q factor of the high dielectric-constant material and yields $ZnAl_2O_4$, $ZnTiO_3$, $Zn_2TiO_4$, $Zn_2Ti_3O_8$ and other crystals having a high Q factor. If the content of ZnO exceeds about 20% by weight, the high dielectric-constant material may have decreased sinterability. $Al_2O_3$ serves to increase the moisture resistance. If the content of $Al_2O_3$ exceeds about 10% by weight, the high dielectric-constant material may have deteriorated sinterability.

BaO, CaO and SrO serve to increase the sinterability. If the content of these components exceed about 10% by weight, the high dielectric-constant material may have a decreased Q factor. BaO yields $BaTi_4O_9$, $Ba_2Ti_9O_{20}$ and other crystals having a high Q factor.

The high dielectric-constant material preferably further comprises less than or equal to about 3% by weight of CuO based on the total weight of the material, as a secondary component. The secondary component CuO serves as a sintering aid. However, if the content of CuO exceeds about 3% by weight, the resulting high dielectric-constant material may have a decreased Q factor or a thermal coefficient of electrostatic capacity shifted to a high positive value. The high dielectric-constant material may further comprise about 0.1% to 10% by weight of $TiO_2$ as a secondary component, in addition to the above major components. $TiO_2$ serves to enhance crystallization of the glass component. However, if the content of $TiO_2$ exceeds about 10% by weight based on the total weight of the high dielectric-constant material, the sinterability may be deteriorated.

If the content of the first glass composition in the high dielectric-constant material is less than about 15% by weight, the resulting material may become resistant to sintering. If it exceeds about 35% by weight, the high dielectric-constant material may have deteriorated moisture resistance or a decreased relative dielectric constant. Accordingly, the high dielectric-constant material preferably comprises about 15% to 35% by weight of the first glass composition relative to about 65% to 85% by weight of the $BaO-TiO_2-ReO_{3/2}$ dielectric.

The low dielectric-constant material comprises a ceramic and a second glass composition. As the ceramic, $MgAl_2O_4$ can advantageously be used.

Various glass compositions can be used as the second glass composition, as long as they can yield a low dielectric-constant layer having a relative dielectric constant εr of less than or equal to about 10. Preferably, the following first and second types of glass compositions are used as the second glass composition.

The first-type second glass composition comprises about 30% to 50% by mole, and preferably about 35% to 45% by mole, of silicon oxides in terms of $SiO_2$, 0% to about 20% by mole, and preferably about 5% to 15% by mole, of boron oxides in terms of $B_2O_3$, and about 20% to 55% by mole, and preferably about 25% to 35% by mole, of magnesium oxide in terms of MgO.

If the content of the silicon oxides is less than about 30% by mole, the resulting low dielectric-constant material may have a decreased degree of crystallinity and may have a decreased Q factor. In contrast, if it exceeds about 50% by mole, the resulting glass component may have an increased melting temperature.

The boron oxides mainly serve as a flux. If the content of the boron oxides in the second glass composition exceeds about 20% by mole, the resulting low dielectric-constant material may have deteriorated moisture resistance.

MgO serves to decrease the melting temperature of the glass component during its manufacture and constitutes a component of the crystals in a crystallized glass. Especially, an MgO—$B_2O_3$ compound has a Qf (the product of the Q factor and the frequency f) of equal to or more than several ten thousands gigahertz and plays a main role to exhibit excellent high-frequency characteristics. If the content of MgO is less than about 20% by mole, the resulting low dielectric-constant material may have a decreased Q factor, and if it exceeds about 55% by mole, the low dielectric-constant material may have decreased strength due to increased amounts of precipitated crystals.

The first-type second glass composition may further comprise 0% to about 15% by mole of aluminum oxide in terms of $Al_2O_3$. The content of the aluminum oxide in terms of $Al_2O_3$ may be 0% by mole. In other words, the aluminum oxide may not necessarily be contained.

If the content of the aluminum oxide in terms of $Al_2O_3$ exceeds about 15% by mole, the resulting sintered compact may not become sufficiently dense and may have a decreased Q value. The lower limit of the aluminum oxide, when present, is more than 0% by mole in terms of $Al_2O_3$.

More preferably, the first-type second glass composition further comprises less than or equal to about 30% by mole of at least one alkaline earth metal oxide selected from BaO, SrO and CaO based on the total mole content of the second glass composition.

The alkaline earth metal oxides serve to decrease the melting temperature of the glass during its manufacture and to increase the thermal expansion coefficient of the glass. If the content of these alkaline earth metal oxides exceeds about 30% by mole, the low dielectric-constant material may have a decreased Q factor.

The first-type second glass composition preferably comprises less than or equal to about 10% by weight, more preferably from about 2% to 5% by weight, of at least one alkali metal oxide selected from $Li_2O$, $K_2O$ and $Na_2O$ based on the total weight of the second glass composition. These alkali metal oxides serve to decrease the melting temperature of the glass during its manufacture. If the content of the alkali metal oxides exceeds about 10% by weight, the low dielectric-constant material may have a decreased Q factor.

The first-type second glass composition preferably further comprises less than or equal to about 15% by weight, and more preferably less than or equal to about 10% by weight, of zinc oxide in terms of ZnO. The zinc oxide serves to decrease the sintering temperature. However, if the content of the zinc oxide in terms of ZnO exceeds about 15% by weight, the resulting sintered compact may not become sufficiently dense.

Preferably, the first-type second glass composition further comprises less than or equal to about 3% by weight, and more preferably less than or equal to about 2% by weight, of copper oxides in terms of CuO. The copper oxides serve to decrease the sintering temperature. However, if the content of the copper oxides exceeds about 3% by weight, the low dielectric-constant material may have a decreased Q factor.

The second-type second glass composition for use in the low dielectric-constant material comprises a borosilicate glass. In the resulting low dielectric-constant layer obtained by using the second-type second glass composition, the major crystalline phases are precipitated in the following first and second manners. In the first manner of precipitation, an $MgAl_2O_4$ crystalline phase and at least one of an $Mg_3B_2O_6$ crystalline phase and an $Mg_2B_2O_5$ crystalline phase are precipitated as major crystalline phases. In the second manner of precipitation, an $MgAl_2O_4$ crystalline phase, an $Mg_2SiO_4$ crystalline phase, and at least one of an $Mg_3B_2O_6$ crystalline phase and an $Mg_2B_2O_5$ crystalline phase are precipitated as major crystalline phases.

The resulting low dielectric-constant layers each including the main crystalline phases precipitated in the first or second manner can constitute insulative layers each having a low relative dielectric constant of less than or equal to about 10 and having excellent high-frequency characteristics.

In the low dielectric-constant materials that can yield the major crystalline phases precipitated in the first or second manner, the borosilicate glass preferably comprises about 8% to 60% by weight of boron oxides in terms of $B_2O_3$, about 10% to 50% by weight of silicon oxides in terms of $SiO_2$, and about 10% to 55% by weight of magnesium oxide in terms of MgO.

The content of boron oxides in terms of $B_2O_3$ in the borosilicate glass is preferably from about 8% to 60% by weight. The boron oxides mainly serve as a flux. If the content of the boron oxides in terms of $B_2O_3$ is less than about 8% by weight, the borosilicate glass may have an excessively high melting temperature, and if it exceeds about 60% by weight, the low dielectric-constant material may have deteriorated moisture resistance.

The content of the silicon oxides in terms of $SiO_2$ is preferably from about 10% to 50% by weight, and more preferably from about 13% to 38% by weight. If the content of the silicon oxides is less than about 10% by weight, the borosilicate glass may have decreased chemical stability, and if it exceeds about 50% by weight, the borosilicate glass may have an increased melting temperature.

The content of the magnesium oxide MgO in the borosilicate glass is preferably from about 10% to 55% by weight, and more preferably from about 35% to 53% by weight. MgO serves to decrease the melting temperature of the glass during its manufacture and constitutes a component of the crystals in the crystallized glass. Especially, an MgO—$B_2O_3$ compound has a Qf (the product of the Q factor and the frequency f) of equal to or more than several ten thousands gigahertz and plays a main role to exhibit excellent high-frequency characteristics. If the content of MgO is less than about 10% by weight, the low dielectric-constant material may have a decreased Q factor, and if it exceeds about 55% by weight, the low dielectric-constant material may have decreased strength due to excessive amounts of precipitated crystals.

When the second-type second glass composition is used, the $Mg_3B_2O_6$ crystalline phase or the $Mg_2B_2O_5$ crystalline phase can selectively be precipitated by controlling the ratio of the magnesium oxide to the boron oxides in the system.

Specifically, if the molar ratio of MgO to $B_2O_3$ is more than about 3:1, the $Mg_3B_2O_6$ crystalline phase can selectively be precipitated. In contrast, if the molar ratio of MgO to $B_2O_3$ is less than about 3:1, the $Mg_2B_2O_5$ crystalline phase can selectively be precipitated. If the ratio is around 3:1, the $Mg_3B_2O_6$ crystalline phase and the $Mg_2B_2O_5$ crystalline phase are precipitated concurrently.

The borosilicate glass preferably further comprises less than or equal to about 20% by weight of at least one alkali metal oxide. The alkali metal oxide serves to decrease the melting temperature of the glass during its manufacture and serves to decrease the sintering temperature. However, if the content of the alkali metal oxide exceeds about 20% by weight, the low dielectric-constant material may have a decreased Q factor. Such alkali metal oxides include, for example, $Na_2O$, $K_2O$ and $Li_2O$.

The thermal expansion coefficient of the low dielectric-constant material can be controlled by adjusting the amount of the alkali metal oxide in the borosilicate glass.

The borosilicate glass preferably further comprises less than or equal to about 30% by weight of zinc oxide in terms of ZnO. The zinc oxide serves to decrease the sintering temperature. However, if the content of the zinc oxide exceeds about 30% by weight, the borosilicate glass may have decreased chemical stability.

The borosilicate glass preferably further comprises less than or equal to about 10% by weight of copper oxides in terms of CuO. The copper oxides serve to decrease the sintering temperature. If the content of the copper oxides exceeds about 10% by weight, the low dielectric-constant material may have a decreased Q factor.

The borosilicate glass preferably further comprises less than or equal to about 20% by weight of aluminum oxide in terms of $Al_2O_3$. The addition of the aluminum oxide can increase chemical stability of the low dielectric-constant material. However, if the content of the aluminum oxide exceeds about 20% by weight, the resulting sintered compact may not become sufficiently dense in some cases.

In the first manner of precipitation, the sintered compact preferably comprises about 5% to 80% by weight of the $MgAl_2O_4$ crystalline phase and about 5% to 70% by weight of the $Mg_3B_2O_6$ crystalline phase and/or $Mg_2B_2O_5$ crystalline phase precipitated therein, based on the total weight of crystalline phases. When the crystalline phases are precipitated within this range, the low dielectric-constant material can have high reliability, satisfactory sinterability, sufficient mechanical strength and a high Q factor. If the content of the $MgAl_2O_4$ crystalline phase is less than about 5% by weight, the low dielectric-constant material may have decreased strength, and if it exceeds about 80% by weight, the low dielectric-constant material may not become sufficiently dense by firing at temperatures less than or equal to 1000° C.

In addition, if the content of the $MgAl_2O_4$ crystalline phase is less than about 5% by weight, the relative content of filler component is decreased, and the relative content of an expensive glass is increased, thus inviting an increased cost. If it exceeds about 80% by weight, the low dielectric-constant material may not become sufficiently dense by firing at temperatures less than or equal to 1000° C. If the total content of the $Mg_3B_2O_6$ crystalline phase and/or $Mg_2B_2O_5$ crystalline phase is less than about 5% by weight, the reaction between magnesium oxide (MgO) and boron oxide ($B_2O_3$) may not proceed sufficiently, and thereby the low dielectric-constant material may have deteriorated sinterability and reliability and a decreased Q factor. To cause these two crystalline phases to precipitate more than about 70% by weight, the amount of the expensive glass must be increased, thus inviting an increased cost.

In the second manner of precipitation, the low dielectric-constant material preferably comprises about 5% to 80% by weight of the $MgAl_2O_4$ crystalline phase and about 5% to 70% by weight of the total of the $Mg_2SiO_4$ crystalline phase and at least one of the $Mg_3B_2O_6$ crystalline phase and the $Mg_2B_2O_5$ crystalline phase precipitated therein, based on the total weight of crystalline phases. When the crystalline phases are precipitated within this range, the resulting low dielectric-constant material can have sufficient sinterability, sufficient mechanical strength, excellent high-frequency characteristics and a high thermal expansion coefficient. If the content of the $MgAl_2O_4$ crystalline phase is less than about 5% by weight, the low dielectric-constant material may have decreased mechanical strength, and if it exceeds about 80% by weight, the low dielectric-constant material may not become sufficiently dense by firing at temperatures of less than or equal to 1000° C. If the total content of the $Mg_2SiO_4$ crystalline phase and at least one of the $Mg_3B_2O_6$ crystalline phase and the $Mg_2B_2O_5$ crystalline phase is less than about 5% by weight, the reaction between magnesium oxide (MgO) and boron oxide ($B_2O_3$) does not proceed sufficiently, and thereby the low dielectric-constant material may have deteriorated sinterability and reliability and a decreased Q factor. If it exceeds about 70% by weight, the amount of the expensive glass must be increased, thus inviting an increased cost.

By using the $MgAl_2O_4$ ceramic and the specific borosilicate glass, the low dielectric-constant material can be obtained by co-firing with a metal material having a low melting point, such as copper or silver, and has sufficient mechanical strength, excellent high-frequency characteristics and a high thermal expansion coefficient.

In the present invention, the low dielectric-constant material preferably has a Q factor of equal to or more than about 700 as measured at a frequency of 15 GHz. When the Q factor at 15 GHz is equal to or more than about 700, the low dielectric-constant material can advantageously be used in circuit boards for the high frequency applications at frequencies of, for example, equal to or more than 1 GHz.

In the present invention, a mixture obtained by calcining glass compositions at temperatures of from about 700° C. to 1000° C. can be used as the second glass composition.

In the low dielectric-constant material, the weight ratio of the ceramic to the second glass composition is preferably from about 20:80 to 80:20, and more preferably from about 30:70 to 50:50. If the weight ratio of the ceramic is higher than the above range, the sintered compact may have a decreased density. In contrast, if the weight ratio of the glass composition exceeds the above range, the low dielectric-constant material may have a decreased Q factor.

In the composite multilayer ceramic electronic part according to the present invention, the difference between the thermal expansion coefficient of the low dielectric-constant layer and that of the high dielectric-constant layer is preferably less than or equal to about 0.5 ppm/°C. When the composite multilayer ceramic electronic part satisfies this requirement, delamination of the resulting substrate due to firing or heating in practical applications can be prevented.

In a method according to the present invention, the composite multilayer ceramic electronic part is manufactured in the following manner. Initially, a ceramic slurry containing a composition for the high dielectric-constant material, a binder and a solvent is formed into a sheet and thereby yields a first ceramic green sheet. Likewise, a composition for the low dielectric-constant material, a binder and a solvent are kneaded to yield a slurry, and the slurry is formed into a sheet and thereby yields a second ceramic green sheet. At least one ply of the first ceramic green sheet is laminated with at least one ply of the second ceramic green sheet to yield a laminate. These steps of manufacturing the ceramic green sheets and forming the laminate can be performed pursuant to conventional manufacturing methods for multilayer capacitors or multilayer ceramic substrates.

Next, two plies of a third ceramic green sheet are laminated onto the top and bottom faces of the laminate, and the laminate is fired in such a manner that the third ceramic green sheet is pressed to and sandwiches the laminate. A ceramic green sheet mainly comprising a ceramic having a sintering temperature of higher than the sintering temperatures of the low dielectric-constant material and the high dielectric-constant material is used as the third ceramic green sheet. Accordingly, when the laminate is sintered and thereby yields the composite multilayer ceramic electronic part according to the present invention, the third ceramic green sheet is not sintered at this temperature, i.e. the temperature at which the first and second ceramic green sheets are sintered. The sintering operation does not shrink the sintered laminate in an in-plane direction in the top and bottom faces but only in the thickness direction. By this configuration, the resulting composite multilayer ceramic electronic part has sufficient flatness even when the high dielectric-constant material and the low dielectric-constant material exhibit different shrinkage profiles during firing.

Ceramic materials for constituting the third ceramic green sheet are not specifically limited, as long as they each have a sintering temperature higher than those of the low dielectric-constant material and the high dielectric-constant material. For example, a green sheet that is not sintered at temperatures less than or equal to 1000° C. and comprises alumina can be used as the third ceramic green sheet.

The present invention will be illustrated in further detail with reference to specific examples of the composite ceramic electronic part of the present invention.

EXPERIMENTAL EXAMPLE 1

(1) Preparation of High Dielectric-constant Materials
Preparation of Ceramic Compositions As starting materials, $BaCO_3$, $TiO_2$, $Nd_2O_3$, $Sm_2O_3$ and $Pr_2O_3$ were weighed and sufficiently mixed to yield mixtures having the compositional ratios of BaO, $TiO_2$ and $ReO_{3/2}$ (a rare earth oxide) shown in Table 1 below. The mixtures were calcined at 1150° C. for 1 hour, and the resulting calcined mixtures were pulverized and thereby yielded ceramic compositions S1 to S10 shown in Table 1.

TABLE 1

| Ceramic | Major Component (mole %) | | |
|---|---|---|---|
| Number | BaO | $TiO_2$ | $ReO_{3/2}$ |
| S1 | 13 | 58 | Nd: 10, Sm: 19 |
| S2 | 25 | 55 | Nd: 20 |
| S3 | 5 | 75 | Nd: 20 |
| S4 | 2 | 65 | Nd: 33 |
| S5 | 10 | 50 | Nd: 40 |
| S6 | 18 | 62 | Nd: 20 |
| S7 | 8 | 65 | Nd: 27 |
| S8 | 8 | 52.5 | Nd: 39.5 |
| S9 | 13 | 58 | Sm: 29 |
| S10 | 13 | 58 | Pr: 6, Sm: 23 |

Preparation of First Glass Compositions

As starting materials, $B_2O_3$, $SiO_2$, ZnO, MgO, $Li_2O$, $Al_2O_3$, BaO, CaO and SrO were weighed and sufficiently mixed to yield mixtures having the compositional ratios shown in Table 2 below. The mixtures were melted at temperatures from 1100° C. to 1400° C., were quenched by putting into water, and were wet-milled thereby yielded glass compositions G1 to G24 shown in Table 2.

TABLE 2

| Glass No. | MgO (wt. %) | ZnO (wt. %) | $Al_2O_3$ (wt. %) | $B_2O_3$ (wt. %) | $SiO_2$ (wt. %) | $Li_2O$ (wt. %) | BaO (wt. %) | SrO (wt. %) | CaO (wt. %) |
|---|---|---|---|---|---|---|---|---|---|
| G1 | 40 | 7 | 1.5 | 28.5 | 15.5 | 7.5 | — | — | — |
| G2 | 15 | 20 | 1.5 | 45.0 | 20.0 | 7.5 | — | — | — |
| G3 | 25 | 15 | 1.5 | 40.0 | 18.0 | 0.5 | — | — | — |
| G4 | 55 | 5 | 1.5 | 15.0 | 15.0 | 8.5 | — | — | — |
| G5 | 65 | 5 | 1.5 | 10.0 | 15.0 | 3.5 | — | — | — |
| G6 | 42 | 0 | 1.5 | 30.5 | 18.5 | 7.5 | — | — | — |
| G7 | 40 | 8.5 | 0 | 28.5 | 15.5 | 7.5 | — | — | — |
| G8 | 38 | 7 | 5 | 27 | 15.5 | 7.5 | — | — | — |
| G9 | 37 | 7 | 10 | 26 | 14.5 | 5.5 | — | — | — |
| G10 | 28 | 7 | 1.5 | 50 | 5 | 8.5 | — | — | — |
| G11 | 42 | 7 | 1.5 | 30 | 10 | 9.5 | — | — | — |
| G12 | 30 | 7 | 1.5 | 20 | 35 | 6.5 | — | — | — |
| G13 | 42 | 9 | 1.5 | 30.5 | 17 | 0 | — | — | — |
| G14 | 38 | 5 | 1.5 | 26.5 | 14 | 15 | — | — | — |
| G15 | 37 | 5 | 1.5 | 24.5 | 13 | 20 | — | — | — |
| G16 | 39 | 7 | 1.5 | 28.5 | 15.5 | 7.5 | 1 | — | — |
| G17 | 30 | 7 | 1.5 | 28.5 | 15.5 | 7.5 | 10 | — | — |
| G18 | 25 | 7 | 1.5 | 28.5 | 15.5 | 7.5 | 15 | — | — |
| G19 | 39 | 7 | 1.5 | 28.5 | 15.5 | 7.5 | — | 1 | — |
| G20 | 30 | 7 | 1.5 | 28.5 | 15.5 | 7.5 | — | 10 | — |
| G21 | 25 | 7 | 1.5 | 28.5 | 15.5 | 7.5 | — | 15 | — |
| G22 | 39 | 7 | 1.5 | 28.5 | 15.5 | 7.5 | — | — | 1 |
| G23 | 30 | 7 | 1.5 | 28.5 | 15.5 | 7.5 | — | — | 10 |
| G24 | 25 | 7 | 1.5 | 28.5 | 15.5 | 7.5 | — | — | 15 |

Preparation of Dielectric Ceramics Constituting High Dielectric-constant Layer

First glass compositions G1 to G24 was added to and mixed with the above-prepared ceramic compositions S1 to S10 at the compositional ratios shown in Tables 3 and 4. As secondary components, CuO and $TiO_2$ powders were respectively added to and sufficiently mixed with the mixtures in proportions shown in Table 3 and thereby yielded compositions for the high dielectric-constant materials. Subsequently, appropriate amounts of a binder, plasticizer and solvent were added to and kneaded with the compositions for the high dielectric-constant materials to thereby yield slurries.

Each of the above-prepared slurries was formed into a sheet 50-μm thick by a doctor blade process. The resulting ceramic green sheet was cut into rectangular ceramic green sheets 30-mm long and 10-mm wide. Plural plies of the rectangular ceramic green sheets was laminated and compressed to thereby yield a laminate 0.5-mm thick. The laminate was then fired at temperatures from 800° C. to 1100° C. for 1 hour to thereby yield plate-shaped dielectric ceramics, Samples K1 to K25, shown in Table 3 and dielectric ceramics, Samples K26 to K43, shown in Table 4.

The relative dielectric constant ($\epsilon r$), Q factor and thermal expansion coefficient α or temperature-dependent change of electrostatic capacity P (ppm/°C.) of each of the plate-shaped dielectric ceramics were determined. The relative dielectric constant was determined at 1 MHZ, and the Q factor was determined by a method using a dielectric resonator. The results are shown in Tables 3 and 4.

TABLE 3

| Sample No. | Ceramic composition No. | Amount (wt. %) | Glass composition No. | Amount (wt. %) | CuO amount (wt. %) | $TiO_2$ amount (wt. %) | Firing temperature (° C.) | Relative dielectric constant $\epsilon r$ | Qf (GHz) | α (ppm/° C.) | Remarks |
|---|---|---|---|---|---|---|---|---|---|---|---|
| K1 | S1 | 73 | G1 | 22 | 1 | 4 | 900 | 31 | 12000 | 9.9 | |
| K2 | S1 | 73 | G2 | 22 | 1 | 4 | 850 | 30 | 2500 | 10.2 | poor moisture resistance |
| K3 | S1 | 73 | G3 | 22 | 1 | 4 | 900 | 29 | 5000 | 10.1 | |
| K4 | S1 | 73 | G4 | 22 | 1 | 4 | 900 | 31 | 6500 | 9.7 | |
| K5 | S1 | 73 | G5 | 22 | 1 | 4 | — | — | — | — | not vitrified |
| K6 | S1 | 73 | G6 | 22 | 1 | 4 | 900 | 30 | 9000 | 9.8 | |
| K7 | S1 | 73 | G7 | 22 | 1 | 4 | 900 | 31 | 9500 | 10.0 | |
| K8 | S1 | 73 | G8 | 22 | 1 | 4 | 900 | 28 | 7500 | 9.6 | |
| K9 | S1 | 73 | G9 | 22 | 1 | 4 | 1050 | 28 | 5500 | 9.4 | high sintering temperature |
| K10 | S1 | 73 | G10 | 22 | 1 | 4 | 850 | 32 | 2000 | 10.3 | low Q |
| K11 | S1 | 73 | G11 | 22 | 1 | 4 | 900 | 30 | 6000 | 10.1 | |
| K12 | S1 | 73 | G12 | 22 | 1 | 4 | 1100 | 28 | 4000 | 9.7 | high sintering temperature |
| K13 | S1 | 73 | G13 | 22 | 1 | 4 | 1050 | 29 | 6000 | 9.7 | high sintering temperature |
| K14 | S1 | 73 | G14 | 22 | 1 | 4 | 850 | 30 | 5000 | 10.2 | |
| K15 | S1 | 73 | G15 | 22 | 1 | 4 | 800 | 29 | 3000 | 10.4 | poor moisture resistance |
| K16 | S1 | 55 | G1 | 40 | 1 | 4 | 850 | 18 | 4000 | 10.1 | low $\epsilon$ |
| K17 | S1 | 65 | G1 | 30 | 1 | 4 | 880 | 24 | 6000 | 10.0 | |
| K18 | S1 | 85 | G1 | 15 | 0 | 0 | 1000 | 38 | 5500 | 9.9 | |
| K19 | S1 | 90 | G1 | 8 | 1 | 1 | 1100 | 43 | 6000 | 9.8 | high sintering temperature |
| K20 | S1 | 60 | G1 | 35 | 1 | 4 | 850 | 21 | 4500 | 10.0 | |
| K21 | S1 | 61 | G1 | 22 | 3 | 4 | 850 | 33 | 5000 | 10.0 | |
| K22 | S1 | 70 | G1 | 22 | 5 | 3 | 800 | 35 | 2000 | 10.0 | low Q |
| K23 | S1 | 76.9 | G1 | 22 | 1 | 0.1 | 900 | 32 | 9000 | 10.1 | |
| K24 | S1 | 67 | G1 | 22 | 1 | 10 | 1000 | 35 | 10000 | 10.1 | |
| K25 | S1 | 62 | G1 | 22 | 1 | 15 | 1100 | 37 | 9000 | 10.1 | high sintering temperature |

TABLE 4

| Sample No. | Ceramic composition No. | Amount (wt. %) | Glass composition No. | Amount (wt. %) | CuO amount (wt. %) | $TiO_2$ amount (wt. %) | Firing temperature (° C.) | Relative dielectric constant $\epsilon r$ | Qf (GHz) | Temperature-dependent change β (ppm/° C.) | Remarks |
|---|---|---|---|---|---|---|---|---|---|---|---|
| K26 | S2 | 73 | G1 | 22 | 1 | 4 | 900 | 37 | 3000 | −100 | low b |
| K27 | S3 | 73 | G1 | 22 | 1 | 4 | 900 | 21 | 4000 | −160 | low b |
| K28 | S4 | 73 | G1 | 22 | 1 | 4 | 900 | 16 | 3000 | +20 | low e |
| K29 | S5 | 73 | G1 | 22 | 1 | 4 | 900 | 14 | 4000 | +90 | low e |
| K30 | S6 | 73 | G1 | 22 | 1 | 4 | 900 | 33 | 8500 | −60 | |
| K31 | S7 | 73 | G1 | 22 | 1 | 4 | 900 | 33 | 6000 | −60 | |
| K32 | S8 | 73 | G1 | 22 | 1 | 4 | 900 | 25 | 5500 | −60 | |
| K33 | S9 | 73 | G1 | 22 | 1 | 4 | 900 | 30 | 12000 | +18 | |
| K34 | S10 | 73 | G1 | 22 | 1 | 4 | 900 | 31 | 10000 | +4 | |
| K35 | S1 | 73 | G16 | 22 | 1 | 4 | 900 | 32 | 6000 | +10 | |
| K36 | S1 | 73 | G17 | 22 | 1 | 4 | 900 | 33 | 3000 | +14 | |
| K37 | S1 | 73 | G18 | 22 | 1 | 4 | 900 | 34 | 1500 | +18 | low Q |
| K38 | S1 | 73 | G19 | 22 | 1 | 4 | 900 | 32 | 8000 | +10 | |
| K39 | S1 | 73 | G20 | 22 | 1 | 4 | 900 | 33 | 3500 | +12 | |
| K40 | S1 | 73 | G21 | 22 | 1 | 4 | 900 | 34 | 1800 | +15 | low Q |
| K41 | S1 | 73 | G22 | 22 | 1 | 4 | 900 | 31 | 10000 | +10 | |

TABLE 4-continued

| Sample No. | Ceramic composition No. | Amount (wt. %) | Glass composition No. | Amount (wt. %) | CuO amount (wt. %) | TiO$_2$ amount (wt. %) | Firing temperature (° C.) | Relative dielectric constant εr | Qf (GHz) | Temperature-dependent change β (ppm/° C.) | Remarks |
|---|---|---|---|---|---|---|---|---|---|---|---|
| K42 | S1 | 73 | G23 | 22 | 1 | 4 | 900 | 32 | 4000 | +11 | |
| K43 | S1 | 73 | G24 | 22 | 1 | 4 | 900 | 33 | 2000 | +13 | low Q |

Table 4 shows that the dielectric ceramics K37, K40 and K43 each had a low Qf of less than or equal to 2000.

(2) Preparation of Low Dielectric-constant Materials

As starting material powders, Mg(OH)$_2$ and Al$_2$O$_3$ powders were weighed to yield a stoichiometric composition of MgAl$_2$O$_4$ and were wet-mixed for 16 hours. The resulting mixture was dried, calcined at a temperature of 1350° C. for 2 hours and was pulverized. The pulverized composition as a ceramic powder was then weighed, and each of the second glass compositions A to Q each having a composition shown in Table 5 and serving as a sintering aid, and where necessary, a CuO powder, were mixed with the pulverized composition in the proportions shown in Table 6 to thereby yield compositions for the low dielectric-constant materials. The compositions for the low dielectric-constant materials were then granulated with an appropriate amount of a binder, and the resulting granules were molded at a pressure of 2000 kg/cm$^2$ to thereby yield a disk-shaped green compacts 12-mm in diameter and 7 mm in thickness. The green compacts were fired at 900° C. to 1000° C. in the air for 2 hours to thereby yield disk-shaped insulative ceramic samples. The relative dielectric constant and Q factor of each of the samples were determined at 15 GHz by a method using a both-ends-short-circuited dielectric resonator.

Separately, a ceramic slurry was prepared using each of the insulative ceramic material, was formed into a sheet 50-μm thick by the doctor blade process to thereby yield a ceramic green sheet. An electrode pattern made of Ag was formed on the ceramic green sheet by printing to thereby yield a laminate for a multilayer capacitor. The laminate was fired at 900° C. for 30 minutes to obtain a rectangular parallelepiped ceramic sintered compact. An outer electrode was formed on the sintered compact to constitute a multilayer ceramic capacitor. A voltage of 50 V was applied to the multilayer capacitor, the multilayer capacitor was allowed to stand at 120° C., relative humidity of 95% and 2 atm for 200 hours, and was then recovered. The change of the insulating resistance of the resulting multilayer capacitor was determined to assess the moisture resistance thereof. The thermal expansion coefficient of each of the above-prepared insulative ceramics was determined. The results are shown in Table 6.

TABLE 5

| | SiO$_2$ (mole %) | B$_2$O$_3$ (mole %) | MgO (mole %) | Al$_2$O$_3$ (mole %) | CaO (mole %) | SrO (mole %) | BaO (mole %) | ZnO (mole %) | Li$_2$O (mole %) | Na$_2$O (mole %) | K$_2$O (mole %) |
|---|---|---|---|---|---|---|---|---|---|---|---|
| A | 30 | 15 | 55 | — | — | — | — | — | — | — | — |
| B | 30 | 5 | 30 | — | 30 | — | — | — | 5 | — | — |
| C | 40 | — | 25 | 15 | — | — | 15 | — | 5 | — | — |
| D | 50 | 10 | 30 | — | — | — | 10 | — | — | — | — |
| E | 35 | 20 | 20 | — | — | — | 20 | — | 5 | — | — |
| F | 40 | 5 | 30 | 10 | — | 15 | — | — | — | — | — |
| G | 30 | 15 | 35 | — | — | — | 5 | 5 | 5 | 5 | — |
| H | 35 | 3 | 30 | 5 | — | — | 25 | — | — | — | 2 |
| I | 35 | 10 | 30 | — | 5 | — | 5 | 5 | 10 | — | — |
| J | 29 | 16 | 55 | — | — | — | — | — | — | — | — |
| K | 30 | 14 | 56 | — | — | — | — | — | — | — | — |
| L | 35 | 21 | 20 | — | — | — | — | 20 | 4 | — | — |
| M | 51 | 10 | 34 | — | — | — | — | — | 5 | — | — |
| N | 35 | 20 | 19 | — | 20 | — | — | — | 6 | — | — |
| O | 44 | — | 30 | 16 | — | — | — | — | 10 | — | — |
| P | 30 | 5 | 30 | — | 31 | — | — | — | 10 | — | — |
| Q | 35 | 10 | 30 | — | 5 | — | 5 | 5 | 11 | — | — |

TABLE 6

| No. | MgAl$_2$O$_4$ (wt. %) | Glass Amount (wt. %) | Glass Type | CuO (wt. %) | Firing temperature (° C.) | Thermal expansion coefficient (ppm/° C.) | εr | Q | Remarks |
|---|---|---|---|---|---|---|---|---|---|
| L1 | 40 | 60 | A | 0 | 900 | 9.6 | 6.9 | 700 | |
| L2 | 40 | 60 | A | 3 | 900 | 9.6 | 7.0 | 720 | |
| L3 | 20 | 80 | B | 3 | 900 | 9.7 | 7.0 | 750 | |
| L4 | 20 | 80 | B | 4 | 900 | 9.8 | 7.0 | 760 | poor moisture resistance |
| L5 | 20 | 80 | C | 3 | 900 | 10.4 | 7.0 | 750 | |

TABLE 6-continued

| No. | MgAl$_2$O$_4$ (wt. %) | Glass Amount (wt. %) | Glass Type | CuO (wt. %) | Firing temperature (° C.) | Thermal expansion coefficient (ppm/° C.) | εr | Q | Remarks |
|---|---|---|---|---|---|---|---|---|---|
| L6 | 20 | 80 | D | 3 | 900 | 9.5 | 7.0 | 700 | |
| L7 | 10 | 90 | D | 3 | 900 | 9.4 | 6.8 | 300 | low Q |
| L8 | 50 | 50 | E | 0 | 900 | 10.0 | 7.0 | 800 | |
| L9 | 50 | 50 | E | 1 | 900 | 10.0 | 7.0 | 850 | |
| L10 | 60 | 40 | E | 0 | 900 | 9.9 | 7.1 | 700 | |
| L11 | 80 | 20 | E | 3 | 900 | 10.2 | 7.0 | 700 | |
| L12 | 90 | 10 | E | 0 | 1000 | — | — | — | not sintered |
| L13 | 50 | 50 | F | 0 | 900 | 9.9 | 7.1 | 720 | |
| L14 | 40 | 60 | F | 2 | 900 | 9.7 | 6.9 | 700 | |
| L15 | 40 | 60 | G | 0 | 900 | 10.1 | 7.1 | 700 | |
| L16 | 70 | 30 | G | 3 | 900 | 10.5 | 7.3 | 720 | |
| L17 | 40 | 60 | G | 3 | 900 | 10.2 | 7.0 | 800 | |
| L18 | 30 | 70 | G | 1 | 900 | 10.0 | 6.9 | 750 | |
| L19 | 70 | 30 | H | 3 | 900 | 10.0 | 7.2 | 700 | |
| L20 | 60 | 40 | H | 1 | 900 | 10.1 | 7.1 | 700 | |
| L21 | 50 | 50 | H | 0 | 900 | 10.3 | 6.9 | 720 | |
| L22 | 40 | 60 | H | 0 | 900 | 10.4 | 6.9 | 700 | |
| L23 | 40 | 60 | I | 3 | 900 | 10.0 | 6.9 | 750 | |
| L24 | 40 | 60 | J | 0 | 1000 | 9.6 | 6.9 | 300 | low Q |
| L25 | 40 | 60 | J | 3 | 1000 | 9.6 | 7.0 | 330 | low Q |
| L26 | 40 | 60 | K | 0 | 1000 | — | — | — | not sintered |
| L27 | 40 | 60 | K | 3 | 1000 | — | — | — | not sintered |
| L28 | 50 | 50 | L | 1 | 900 | 10.0 | 7.0 | 550 | poor moisture resistance |
| L29 | 60 | 40 | L | 0 | 900 | 9.9 | 7.1 | 580 | poor moisture resistance |
| L30 | 80 | 20 | L | 3 | 900 | 10.2 | 7.0 | 600 | poor moisture resistance |
| L31 | 20 | 80 | M | 3 | 900 | 9.6 | 7.0 | 300 | low Q |
| L32 | 50 | 50 | N | 0 | 900 | 10.0 | 7.0 | 330 | low Q |
| L33 | 20 | 80 | O | 3 | 900 | 10.4 | 7.0 | 330 | low Q |
| L34 | 20 | 80 | P | 3 | 900 | 10.4 | 7.0 | 330 | low Q |
| L35 | 40 | 60 | I | 3 | 900 | 10.2 | 6.9 | 600 | poor moisture resistance |

(3) Manufacture of Composite Multilayer Ceramic Electronic Parts

Using the composition K18 for the high dielectric-constant material and the composition L8 for the low dielectric-constant material prepared in the assessments in (1) and (2) above, first and second ceramic green sheets were prepared, respectively. The first ceramic green sheet for the high dielectric-constant material had a thickness after firing of 250 μm and the second ceramic green sheet for the low dielectric-constant material had a thickness after firing of 125 μm. The first and second ceramic green sheets were respectively cut to 5×5 cm square-shaped plies. Subsequently, two plies of the second ceramic green sheet were laminated and compressed onto the top and bottom faces of the first ceramic green sheet and thereby yielded a laminate. The laminate was then fired and thereby yielded a composite multilayer ceramic sintered compacts T11 and T16 shown in Table 7.

Separately, a series of first and second ceramic green sheets was prepared respectively by using each of the above-prepared compositions for the high dielectric-constant materials and the above-prepared compositions for the low dielectric-constant materials. Two plies of the second ceramic green sheet were laminated and compressed onto the top and bottom faces of the first ceramic green sheet thereby yield a laminate in the same manner as above, and two plies of an alumina green sheet having a thickness after firing of 200 μm were then laminated onto and pressed to the top and bottom faces of the laminate by pressurizing in the thickness direction. The resulting laminate directly sandwiched and compressed between the two plies of the third ceramic green sheet containing alumina was fired at such a firing temperature that the first and second ceramic green sheets were sintered but the third ceramic green sheet was not sintered. The third ceramic green sheet was then removed to yield composite multilayer ceramic sintered compacts T1 to T10, T12 to T15 and T17 to T23.

The interface between a high dielectric-constant layer and a low dielectric-constant layer of each of the above-prepared composite multilayer ceramic sintered compacts was subjected to microscopic observation. Based on the microscopic observation, a sample exhibiting neither cracking nor delamination was assessed as having good integrity and was marked with an O in Table 7. A sample exhibiting any cracking or delamination was assessed as having poor integrity and was marked with an X in Table 7.

Among the above-prepared composite multilayer ceramic sintered compacts, a sample exhibiting a shrinkage percentage of less than or equal to 1% in an in-plane direction of the ceramic green sheet and exhibiting neither chipping nor delamination was assessed as capable of being fired without shrinkage and was marked with an O in Table 7. A sample which did not satisfy these criteria was marked with an X in Table 7.

The results are shown in Table 7.

TABLE 7

| Composite | High dielectric-constant material | Low dielectric-constant material | Integrty | Firing without shrinkage |
|---|---|---|---|---|
| T1 | K1 | L1 | O | O |
| T2 | K3 | L2 | O | O |
| T3 | K4 | L3 | O | O |
| T4 | K6 | L5 | O | O |
| T5 | K7 | L6 | O | O |
| T6 | K8 | L8 | O | O |

TABLE 7-continued

| Composite | High dielectric-constant material | Low dielectric-constant material | Integrty | Firing without shrinkage |
|---|---|---|---|---|
| T7 | K11 | L9 | O | O |
| T8 | K11 | L10 | O | O |
| T9 | K14 | L11 | O | O |
| T10 | K17 | L13 | O | O |
| T11 | K18 | L8 | O | X |
| T12 | K20 | L14 | O | O |
| T13 | K21 | L15 | O | O |
| T14 | K23 | L16 | O | O |
| T15 | K24 | L17 | O | O |
| T16 | K18 | L6 | X | — |
| T17 | K1 | L18 | O | O |
| T18 | K1 | L19 | O | O |
| T19 | K18 | L9 | O | O |
| T20 | K1 | L20 | O | O |
| T21 | K1 | L21 | O | O |
| T22 | K1 | L22 | O | O |
| T23 | K1 | L23 | O | O |

EXPERIMENTAL EXAMPLE 2

In Experimental Example 2, the procedure of Experimental Example 1 was repeated, except that low dielectric-constant materials were prepared in the following manner.

Preparation of Low Dielectric-constant Materials

As starting material powders, $Mg(OH)_2$ and $Al_2O_3$ powders were weighed to yield a stoichiometric composition of $MgAl_2O_4$ and were wet-mixed for 16 hours. The resulting mixture was dried, calcined at a temperature of 1350° C. for 2 hours and was pulverized. The pulverized composition as a ceramic powder was then weighed to a proportion of 20% to 80% by weight in the resulting mixtures, and second glass compositions having the compositions shown in Table 8 and serving as a sintering aid, and an appropriate amount of a binder were mixed with the pulverized composition and thereby yielded compositions for the low dielectric-constant materials. The compositions for the low dielectric-constant materials were then granulated with an appropriate amount of a binder, and the resulting granules were molded at a pressure of 200 MPa to thereby yield disk-shaped green compacts 12-mm in diameter and 7-mm in thickness.

The above-prepared disk-shaped green compacts were fired in the air at 850° C. to 1000° C. for 2 hours, thereby yielding insulative ceramic samples, The relative dielectric constant εr and Q factor of the insulative ceramic samples were determined at 15 GHz by the method using a dielectric resonator. The results are shown in Table 9.

Samples of each of the above-prepared disk-shaped samples was pulverized and analyzed by X-ray diffractometry (XRD) spectrum to determine the presence or absence of $MgAl_2O_4$, $Mg_3B_2O_6$, $Mg_2B_2O_5$ and $Mg_2SiO_4$ crystalline phases. The results are shown in Table 9. In Table 9, the symbols "SP", "KO", "SU" and "FO" mean the $MgAl_2O_4$, $Mg_3B_2O_6$, $Mg_2B_2O_5$ and $Mg_2SiO_4$ crystalline phases, respectively.

Each of the above-prepared insulative ceramics composed of the low dielectric-constant materials were cut to an appropriate size, and the thermal expansion coefficient of the cut sample was determined in a temperature range from room temperature to 600° C. The results are shown as the thermal expansion coefficients in Table 9.

TABLE 8

(Glass Composition)

| | $SiO_2$ (wt. %) | $B_2O_3$ (wt. %) | MgO (wt. %) | $Li_2O$ (wt. %) | ZnO (wt. %) | CuO (wt. %) | $Al_2O_3$ (wt. %) |
|---|---|---|---|---|---|---|---|
| LG1 | 13.5 | 33.9 | 52.6 | — | — | — | — |
| LG2 | 13.5 | 33.9 | 47.6 | 5 | — | — | — |
| LG3 | 11.5 | 29 | 44.5 | 5 | 10 | — | — |
| LG4 | 18.0 | 25.2 | 45.8 | 5 | 5 | 1 | — |
| LG5 | 20 | 41 | 28 | 3 | 5 | 1 | 2 |
| LG6 | 26 | 18 | 45 | 5 | 5 | 1 | — |
| LG7 | 35 | 15 | 40 | 6 | 2 | 2 | — |
| LG8 | 22 | 35 | 35 | 10 | 5 | 1 | 2 |
| LG9 | 12 | 60 | 28 | — | — | — | 5 |
| LG10 | 19.5 | 20 | 49.5 | 5 | 5 | 1 | — |
| LG11 | 20 | 22 | 47 | 5 | 5 | 1 | — |
| LG12 | 40 | 10 | 36 | 9 | 5 | — | — |
| LG13 | 35 | 18 | 50 | 2 | | — | — |
| LG14 | 13.1 | 22.6 | 42.3 | 10 | 10 | — | 2 |

TABLE 9

| No. | $MgAl_2O_4$ (wt. %) | Glass Amount (wt. %) | Type | Firing Temperature (° C.) | Crystalline phase | Thermal expansion coefficient (ppm/° C.) | εr | Q at 15 GHz |
|---|---|---|---|---|---|---|---|---|
| L41 | 20 | 80 | LG1 | 920 | SP, SU | 9.3 | 7.3 | 3000 |
| L42 | 35 | 65 | LG1 | 1000 | SP, SU | 9.2 | 7.0 | 2400 |
| L43 | 30 | 70 | LG2 | 950 | SP, SU | 10.2 | 7.2 | 2600 |
| L44 | 40 | 60 | LG2 | 1000 | SP, SU | 9.9 | 7.1 | 2300 |
| L45 | 35 | 65 | LG3 | 920 | SP, SU | 10.0 | 7.2 | 2100 |
| L46 | 35 | 65 | LG4 | 900 | SP, SU | 10.2 | 7.1 | 2000 |
| L47 | 80 | 20 | LG5 | 1000 | SP, SU | 9.7 | 7.0 | 1800 |
| L48 | 50 | 50 | LG5 | 850 | SP, SU | 9.8 | 7.2 | 1600 |
| L49 | 40 | 60 | LG6 | 900 | SP, SU, FO | 10.0 | 7.0 | 1500 |
| L50 | 35 | 65 | LG7 | 1000 | SP, KO, FO | 9.0 | 6.8 | 800 |
| L51 | 60 | 40 | LG8 | 900 | SP, SU | 11.3 | 7.2 | 3300 |
| L52 | 70 | 30 | LG8 | 950 | SP, SU | 10.8 | 7.4 | 2500 |
| L53 | 50 | 50 | LG9 | 1000 | SP, SU | 9.3 | 7.0 | 700 |
| L54 | 40 | 60 | LG10 | 920 | SP, KO, FO | 9.5 | 7.0 | 2000 |
| L55 | 50 | 50 | LG10 | 1000 | SP, KO, FO | 9.6 | 7.3 | 1800 |
| L56 | 40 | 60 | LG11 | 920 | SP, SU, FO | 9.5 | 7.0 | 1900 |
| L57 | 60 | 40 | LG11 | 1000 | SP, SU, FO | 9.7 | 7.4 | 1300 |

TABLE 9-continued

| No. | MgAl$_2$O$_4$ (wt. %) | Glass Amount (wt. %) | Type | Firing Temperature (° C.) | Crystalline phase | Thermal expansion coefficient (ppm/° C.) | $\epsilon_r$ | Q at 15 GHz |
|---|---|---|---|---|---|---|---|---|
| L58 | 25 | 75 | LG12 | 1000 | SP, KO | 9.2 | 7.5 | 800 |
| L59 | 35 | 65 | LG13 | 950 | SP, KO, FO | 9.0 | 6.8 | 1000 |
| L60 | 25 | 75 | LG14 | 880 | SP, KO | 9.8 | 7.0 | 2600 |

A series of composite multilayer ceramic sintered compacts was prepared and assessed in the same manner as in First Experimental Example, except that the above-prepared and above-assessed compositions for the low dielectric-constant materials were used. In Experimental Example 2, composite ceramic sintered compacts (ceramic sintered compacts T33, T40, T43 and T48 shown in Table 10) were obtained by firing without the use of the third ceramic green sheet containing alumina, and composite multilayer ceramic sintered compacts (ceramic sintered compacts T31, T32, T34 to T39, T41, T42, T44 to T46, T47, T49 to T59 shown in Table 10) were prepared by sandwiching the laminate with the third ceramic green sheet containing alumina and firing the resulting laminate, and these sintered compacts were assessed. The results are shown in Table 10.

In Table 10, the symbol "1)" for composites T49 and T50 means that large pores were observed in the interface between the two materials.

TABLE 10

| Composite | High $\epsilon$ material | Low $\epsilon$ material | Integrity | Firing without shrinkage |
|---|---|---|---|---|
| T31 | K1 | L44 | O | O |
| T32 | K3 | L43 | O | O |
| T33 | K4 | L47 | O | X |
| T34 | K6 | L56 | O | O |
| T35 | K7 | L49 | O | O |
| T36 | K8 | L49 | O | O |
| T37 | K11 | L46 | O | O |
| T38 | K14 | L48 | O | O |
| T39 | K17 | L60 | O | O |
| T40 | K18 | L47 | O | X |
| T41 | K20 | L48 | O | O |
| T42 | K21 | L48 | O | O |
| T43 | K23 | L51 | O | X |
| T44 | K24 | L57 | O | O |
| T45 | K1 | L41 | X | X |
| T46 | K1 | L46 | O | O |
| T47 | K1 | L49 | O | O |
| T48 | K1 | L51 | O | X |
| T49 | K1 | L41 | 1) | O |
| T50 | K1 | L55 | 1) | O |
| T51 | K35 | L1 | O | O |
| T52 | K36 | L1 | O | O |
| T53 | K37 | L1 | O | O |
| T54 | K38 | L1 | O | O |
| T55 | K39 | L1 | O | O |
| T56 | K40 | L1 | O | O |
| T57 | K41 | L1 | O | O |
| T58 | K42 | L1 | O | O |
| T59 | K43 | L1 | O | O |

Next, configurational embodiments of the composite multilayer ceramic electronic part according to the present invention will be illustrated below.

Figure 2:
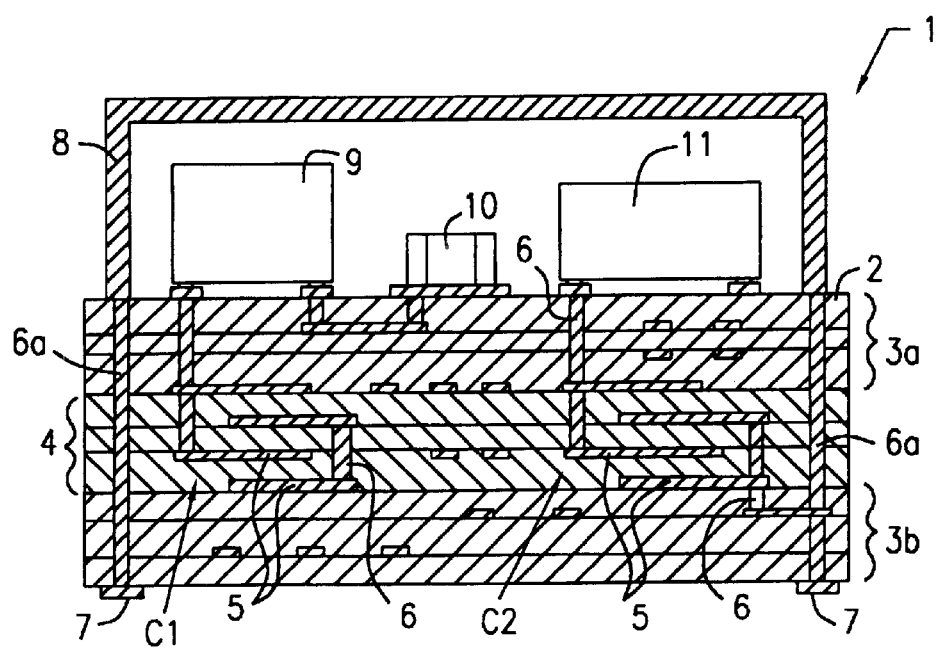
FIGS. 2 and 3 are a longitudinal sectional view and an explosive perspective view, respectively, of a multilayer ceramic module as a ceramic electronic part comprising a multilayer ceramic substrate according to an embodiment of the present invention.
Figure 3:
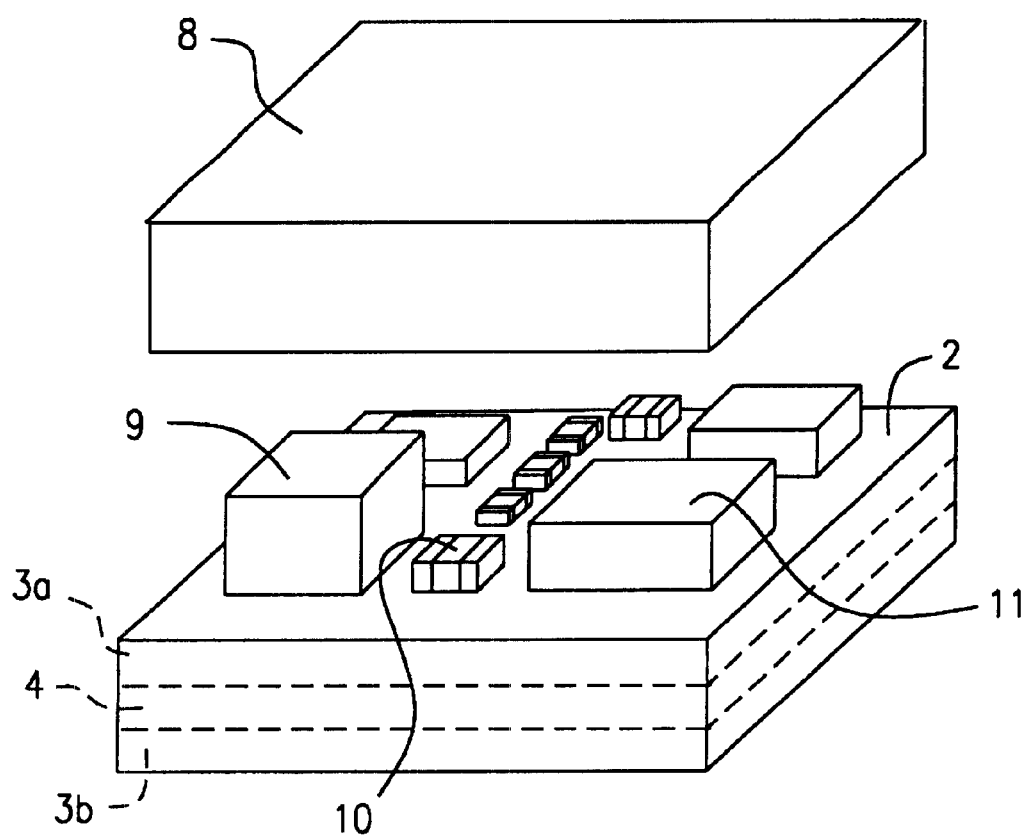

FIGS. 2 and 3 are a sectional view and an exploded perspective view, respectively, of a multilayer ceramic module as a composite multilayer ceramic electronic part containing a multilayer ceramic substrate according to an embodiment of the present invention.

A multilayer ceramic module 1 comprises a multilayer ceramic substrate 2.

The multilayer ceramic substrate 2 includes insulative ceramic layers 3a and 3b as low dielectric-constant layers, and a multilayer ceramic layer 4 as a high dielectric-constant layer sandwiched between the insulative ceramic layers 3a and 3b.

In the ceramic layer 4, a plurality of inner electrodes 5 are arranged adjacent to each other with the interposition of one ply of the constitutional layers of the ceramic layer 4 and thereby constitute multilayer capacitor units C1 and C2.

The ceramic layers 3a and 3b and the ceramic layer 4 include a plurality of via-hole electrodes 6 and 6a and an inner wiring.

Electronic part devices 9 through 11 are mounted onto the top face of the multilayer ceramic substrate 2. As the electronic part devices 9 to 11, appropriate electronic part devices such as semiconductor devices and chip-type multilayer capacitors can be used. The via-hole electrodes 6 and 6a and the inner wiring electrically connect these electronic part devices 9 through 11 to the capacitor units C1 and C2 and thereby constitute the circuit of the multilayer ceramic module 1 according to the present embodiment.

A conductive cap 8 is fixed to the top face of the multilayer ceramic substrate 2. The conductive cap 8 is electrically connected to the via-hole electrodes 6a that penetrate the multilayer ceramic substrate 2 from the top to the bottom. Outer electrodes 7 are formed on the underside of the multilayer ceramic substrate 2 and are electrically connected to the via-hole electrodes 6 and 6a. Other outer electrodes, not shown in the figure, are formed only on the underside of the multilayer ceramic substrate 2 and are electrically connected via the inner wiring to the electronic part devices 9 through 11 and/or the capacitor units C1 and C2.

Thus, by forming the outer electrodes 7 only on the underside of the multilayer ceramic substrate 2 for connection to the outside, the multilayer ceramic module can easily be surface-mounted on, for example, a printed circuit board by the use of the underside.

According to the present embodiment, the cap 8 comprises a conductive material, is electrically connected via the via-hole electrodes 6a to the outer electrodes 7 and thereby can electromagnetically shield the electronic part devices 9 through 11. However, the cap 8 does not necessarily comprise a conductive material.

In the multilayer ceramic module 1 of the present embodiment, the multilayer ceramic substrate 2 includes the ceramic layer 4 as the high dielectric-constant layer and thereby constitutes the multilayer capacitor units C1 and C2, as mentioned above. Accordingly, the inner electrodes 5, electrodes for the outer wiring and the via-hole electrodes 6 and 6a can be made from a low-resistance and low-cost metal such as Ag or Cu, and the multilayer ceramic substrate 2 can be co-fired with these metals. The capacitor units C1 and C2 can be formed by using the multilayer ceramic substrate 2 that can integrally be co-fired, and thereby the multilayer ceramic module 1 can be miniaturized. In addition, the ceramic layer 4 has a high dielectric constant and a high Q factor, and the resulting multilayer ceramic module 1 is suitable for the high frequency applications.

The multilayer ceramic substrate 2 can be easily obtained by known techniques for monolithically firing ceramic laminates. Specifically, ceramic green sheets mainly containing a material for the dielectric ceramic composition according to the present invention are initially prepared, electrode patterns are printed for constituting, for example, the inner electrode 5, the outer wiring and the via-hole electrodes 6 and 6a, and the patterned ceramic green sheets are laminated with each other and thereby yield a laminate. Separately, ceramic green sheets for the insulative ceramic layers 3a and 3b are prepared and are patterned with electrode patterns for the outer electrodes 7 and the via-hole electrodes 6 and 6a. An appropriate number of plies of the patterned ceramic green sheets is laminated onto the above-prepared laminate. The resulting laminate is then pressurized in a thickness direction, is fired and thereby easily yields the multilayer ceramic substrate 2.

The multilayer capacitor units C1 and C2 include the ceramic layer 4 as the high dielectric-constant layer sandwiched between the inner electrodes 5, and the inner electrodes 5 are arranged adjacent to each other in a thickness direction and serve to produce an electrostatic capacity. Accordingly, inner electrodes 5 having a relatively small area can yield a high electrostatic capacity and can thereby further miniaturize the resulting multilayer ceramic module 1.

Other embodiments and variations will be obvious to those skilled in the art, and this invention is not to be limited to the specific matters stated above.

What is claimed is:

1. A composite multilayer ceramic electronic part comprising a laminate comprising:

a high dielectric-constant layer comprising a high dielectric-constant material comprising (a) a $xBaO\text{-}yTiO_2\text{-}zReO_{3/2}$ dielectric in which x, y and z are % by mole and satisfy the following conditions: $8 \leq x \leq 18$, $52.5 \leq y \leq 65$, $20 \leq z \leq 40$ and $x+y+z=100$, and Re is a rare earth element, and (b) a first glass composition, wherein the high dielectric-constant layer has a relative dielectric constant εr of equal to or more than about 20; and at least one low dielectric-constant layer comprising a low dielectric-constant material comprising a composite of a ceramic and a second glass composition, wherein the low dielectric-constant layer has a relative dielectric constant εr of less than or equal to about 10.

2. The composite multilayer ceramic electronic part according to claim 1, wherein the first glass composition in the high dielectric-constant material comprises:

about 10% to 25% by weight of $SiO_2$;
about 10% to 40% by weight of $B_2O_3$;
about 25% to 55% by weight of MgO;
0% to about 20% by weight of ZnO;
0% to about 15% by weight of $Al_2O_3$;
about 0.5% to 10% by weight of $Li_2O$; and 0% to about 10% by weight of RO, where R is at least one member selected from the group consisting of Ba, Sr and Ca.

3. The composite multilayer ceramic electronic part according to claim 1, wherein the high dielectric-constant material further comprises less than or equal to about 3% by weight of CuO and about 0.1% to 10% by weight of $TiO_2$ based on the total weight of the high dielectric-constant material, as secondary components.

4. The composite multilayer ceramic electronic part according to claim 1, wherein the high dielectric-constant material comprises about 15% to 35% by weight of the first glass composition relative to about 65% to 85% by weight of the $xBaO\text{-}yTiO_2\text{-}zReO_{3/2}$ dielectric.

5. The composite multilayer ceramic electronic part according to claim 1, wherein:

the ceramic in the low dielectric-constant material is $MgAl_2O_4$, and the second glass composition comprises:
about 30% to 50% by mole of silicon oxides in terms of $SiO_2$;
0% to about 20% by mole of boron oxides in terms of $B_2O_3$; and
about 20% to 55% by mole of magnesium oxide in terms of MgO.

6. The composite multilayer ceramic electronic part according to claim 5, wherein the second glass composition further comprises less than or equal to about 30% by mole of at least one oxide selected from the group consisting of CaO, SrO and BaO based on the total amount of the glass composition.

7. The composite multilayer ceramic electronic part according to claim 5, wherein the second glass composition comprises less than or equal to about 15% by mole of aluminum oxides in terms of $Al_2O_3$ based on the total weight of the second glass composition.

8. The composite multilayer ceramic electronic part according to claim 5, wherein the second glass composition further comprises less than or equal to about 10% by weight of at least one alkali metal oxide selected from the group consisting of $Li_2O$, $K_2O$ and $Na_2O$ based on the total weight of the second glass composition.

9. The composite multilayer ceramic electronic part according to claim 5, wherein the low dielectric-constant material further comprises less than or equal to about 3% by weight of copper oxides in terms of CuO based on the total weight of the low dielectric-constant material.

10. The composite multilayer ceramic electronic part according to claim 1, wherein:

the ceramic in the low dielectric-constant material is $MgAl_2O_4$, the second glass composition is a borosilicate glass, and the low dielectric-constant layer contains an precipitated crystalline phase comprising an $MgAl_2O_4$ crystalline phase, at least one of an $Mg_3B_2O_6$ crystalline phase and an $Mg_2B_2O_5$ crystalline phase, and optionally an $Mg_2SiO_4$ crystalline phase.

11. The composite multilayer ceramic electronic part according to claim 10, wherein the borosilicate glass comprises:

about 8% to 60% by weight of boron oxides in terms of $B_2O_3$;
about 10% to 50% by weight of silicon oxides in terms of $SiO_2$; and
about 10% to 55% by weight of magnesium oxide in terms of MgO.

12. The composite multilayer ceramic electronic part according to claim 10, wherein the borosilicate glass comprises less than or equal to about 20% by weight of an alkali metal oxide in terms of oxide.

13. The composite multilayer ceramic electronic part according to claim 10, wherein the precipitated crystalline phase of the low dielectric-constant layer comprises:
   about 5% to 80% by weight of the $MgAl2O_4$ crystalline phase; and
   about 5% to 70% by weight of the total of the $Mg_2SiO_4$ crystalline phase, $Mg_3B_2O_6$ crystalline phase and $Mg_2B_2O_5$ crystalline phase present.

14. The composite multilayer ceramic electronic part according to claim 1, wherein the weight ratio of the ceramic to the second glass composition contained in the low dielectric-constant material is from about 20:80 to 80:20.

15. The composite multilayer ceramic electronic part according to claim 1, wherein the low dielectric-constant material and the high dielectric-constant material have thermal expansion coefficients which differ by less than or equal to about 0.5 ppm/°C.

16. The composite multilayer ceramic electronic part according to claim 1, wherein the composite multilayer ceramic electronic part further comprises a conductor comprising Cu, Ag or Au in its interior.

17. A composite multilayer ceramic electronic part comprising a laminate comprising:
   a high dielectric-constant layer having a relative dielectric constant εr of at least about 20 and comprising about 65% to 85% by weight of a high dielectric-constant material and about 15% to 35% by weight of a first glass composition; and
   up to about 3% by weight of CuO and about 0.1% to 10% by weight of $TiO_2$ based on the total weight of the high dielectric-constant material, as secondary components; and
   at least one low dielectric-constant layer having a relative dielectric
   constant εr of not more than about 10 and comprising a low dielectric-constant material comprising a composite of about 20 to 80 weight % of a $MgAl_2O_4$ ceramic and about 80 to 20 weight % of a second glass composition;
   wherein:
   the high dielectric-constant material comprising a $xBaO$—$yTiO_2$—$zReO_{3/2}$ dielectric in which x, y and z are % by mole and satisfy the following conditions: $8 \leq x \leq 18$, $52.5 \leq y \leq 65$, $20 \leq z \leq 40$ and $x+y+z=100$, and Re is a rare earth element;
   the first glass composition in the high dielectric-constant material comprises:
   about 10% to 25% by weight of $SiO_2$;
   about 10% to 40% by weight of $B_2O_3$;
   about 25% to 55% by weight of MgO;
   0% to about 20% by weight of ZnO;
   0% to about 15% by weight of $Al_2O_3$;
   about 0.5% to 10% by weight of $Li_2O$; and
   0% to about 10% by weight of RO, where R is at least one member selected from the group consisting of Ba, Sr, Ca;
   the second glass composition comprises:
   about 30% to 50% by mole of silicon oxides in terms of $SiO_2$;
   0% to about 20% by mole of boron oxides in terms of $B_2O_3$; and
   about 20% to 55% by mole of magnesium oxide in terms of MgO, and further comprises based on the total amount of the $SiO_2$, $B_2O_3$ and MgO, up to about 30% by mole of at least one oxide selected from the group consisting of CaO, SrO and BaO, up to about 15% by mole of aluminum oxides in terms of $Al_2O_3$, up to about 10% by weight of at least one alkali metal oxide selected from the group consisting of $Li_2O$, $K_2O$ and $Na_2O$, up to about 15% by weight zinc oxide in terms of ZnO, and up to about 3% by weight of copper oxides in terms of CuO;
   and wherein the difference in the thermal expansion coefficients between the low dielectric-constant material and the high dielectric-constant material is less than or equal to about 0.5 ppm/°C.

18. The composite multilayer ceramic electronic part according to claim 17, wherein the low dielectric-constant material comprises a composite of about 30 to 50 weight % of the $MgAl_2O_4$ ceramic and about 50 to 30 weight % of the second glass composition; and the second glass composition contains about 2–5% by weight of said alkali metal oxide, up to 10% by weight of said zinc oxide and up to about 2% by weight of said copper oxides.

19. A composite multilayer ceramic electronic part comprising a laminate comprising:
   a high dielectric-constant layer having a relative dielectric constant εr of at least about 20 and comprising about 65% to 85% by weight of a high dielectric-constant material and about 15% to 35% by weight of a first glass composition; and up to about 3% by weight of CuO and about 0.1% to 10% by weight of $TiO_2$ based on the total weight of the high dielectric-constant material, as secondary components; the high dielectric-constant layer; and
   at least one low dielectric-constant layer having a relative dielectric constant εr of less not greater than about 10 and comprising a low dielectric-constant material comprising a composite of about 20 to 80 weight % of a $MgAl_2O_4$ ceramic and about 80 to 20 weight % of a second glass composition;
   wherein:
   the high dielectric-constant material comprising a $xBaO$—$yTiO_2$—$zReO_{3/2}$ dielectric in which x, y and z are % by mole and satisfy the following conditions: $8 \leq x \leq 18$, $52.5 \leq y \leq 65$, $20 \leq z \leq 40$ and $x+y+z=100$, and Re is a rare earth element;
   the first glass composition in the high dielectric-constant material comprises:
   about 10% to 25% by weight of $SiO_2$;
   about 10% to 40% by weight of $B_2O_3$;
   about 25% to 55% by weight of MgO;
   0% to about 20% by weight of ZnO;
   0% to about 15% by weight of $Al_2O_3$;
   about 0.5% to 10% by weight of $Li_2O$; and
   0% to about 10% by weight of RO, where R is at least one member selected from the group consisting of Ba, Sr, Ca;
   the second glass composition is a borosilicate glass comprising:
   about 8% to 60% by weight of boron oxides in terms of $B_2O_3$;
   about 10% to 50% by mole of silicon oxides in terms of $SiO_2$; and
   about 10% to 55% by mole of magnesium oxide in terms of MgO, and further comprises up to about 20% by mole of aluminum oxides in terms of $Al_2O_3$, up to about 20% by weight of at least one alkali metal oxide, up to about 30% by weight zinc oxide in terms of ZnO, and less than or equal to about 10% by weight of copper oxides in terms of CuO;

the low dielectric-constant layer contains a precipitated crystalline phase comprising an $MgAl_2O_4$ crystalline phase, at least one of an $Mg_3B_2O_6$ crystalline phase and an $Mg_2B_2O_5$ crystalline phase, and optionally an $Mg_2SiO_4$ crystalline phase;

and wherein the difference in the thermal expansion coefficients between the low dielectric-constant material and the high dielectric-constant material is less than or equal to about 0.5 ppm/°C.

20. The composite multilayer ceramic electronic part according to claim 19, wherein the low dielectric-constant material comprises a composite of about 30 to 50 weight % of the $MgAl_2O_4$ ceramic and about 50 to 30 weight % of the second glass composition; and the borosilicate glass contains about 13% to 38% by mole of silicon oxides in terms of $SiO_2$ and about 35% to 53% by mole of magnesium oxide in terms of MgO.

21. A method of manufacturing a composite multilayer ceramic electronic part, as in claim 1 the composite multilayer ceramic electronic part comprising at least one high dielectric-constant layer having a relative dielectric constant of equal to or more than about 20; and at least one low dielectric-constant layer having a relative dielectric constant of less than or equal to about 10 and being laminated with the high dielectric-constant layer, the method comprising the steps of:

providing a laminate comprising:
at least one ply of a first ceramic green sheet; and
at least one ply of a second ceramic green sheet;
pressing to and sandwiching the top and bottom faces of the laminate with two plies of a third ceramic green sheet; and
firing the laminate sandwiched between the two plies of the third ceramic green sheets;

wherein:
the first ceramic green sheet comprises a high dielectric-constant material composition for constituting the high dielectric-constant layer,
the second ceramic green sheet comprises a low dielectric-constant material composition for constituting the low dielectric-constant layer, and
the third ceramic green sheet comprises a ceramic having a sintering temperature higher than the sintering temperatures of both of the low dielectric-constant material and the high dielectric-constant material.

* * * * *